(12) United States Patent
Wang et al.

(10) Patent No.: US 9,774,246 B2
(45) Date of Patent: Sep. 26, 2017

(54) THREE-PHASE CURRENT SOURCE RECTIFIER FOR POWER SUPPLIES

(71) Applicant: University of Tennessee Research Foundation, Knoxville, TN (US)

(72) Inventors: Fei Wang, Knoxville, TN (US); Ben Guo, Knoxville, TN (US)

(73) Assignee: UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 313 days.

(21) Appl. No.: 14/511,809

(22) Filed: Oct. 10, 2014

(65) Prior Publication Data

US 2015/0124505 A1    May 7, 2015

Related U.S. Application Data

(60) Provisional application No. 61/889,754, filed on Oct. 11, 2013.

(51) Int. Cl.
*H02M 7/217* (2006.01)
*H02M 1/42* (2007.01)
*H02M 7/219* (2006.01)

(52) U.S. Cl.
CPC ......... *H02M 1/4216* (2013.01); *H02M 7/217* (2013.01); *H02M 7/219* (2013.01); *Y02B 70/126* (2013.01)

(58) Field of Classification Search
CPC ...... H02M 7/217; H02M 7/2173; H02M 7/29; H02M 7/23; H02M 5/02; H02M 5/12; H02M 5/14; H02M 5/257; H02M 5/2573; H02M 5/2576; H02M 5/25; H02M 5/225; H02M 5/27; H02M 5/275; H02M 5/293
See application file for complete search history.

(56) References Cited

U.S. PATENT DOCUMENTS

| | | | |
|---|---|---|---|
| 2007/0053213 A1* | 3/2007 | Brune | H02M 5/4585 363/37 |
| 2008/0219036 A1* | 9/2008 | Colombi | H02J 9/062 363/126 |
| 2012/0300514 A1* | 11/2012 | Kolar | H02J 3/1857 363/41 |

* cited by examiner

*Primary Examiner* — Timothy J Dole
*Assistant Examiner* — Bryan R Perez
(74) *Attorney, Agent, or Firm* — Andrews Kurth Kenyon LLP

(57) ABSTRACT

A three-phase current source rectifier (CSR) with three AC inputs may include a controller, a free-wheeling diode with a cathode connected to a positive line and an anode connected to a negative line, three pairs of switches connected in parallel between the positive line and the negative line, and six pairs of diodes, each pair of the diodes connected in series. Each two pairs of the diodes may be connected in parallel with each other and in series with a respective pair of switches. Each AC input may be connected to between each of two pairs of the diodes.

18 Claims, 14 Drawing Sheets

1700

THREE-PHASE CURRENT SOURCE RECTIFIER FOR POWER SUPPLIES

CROSS-REFERENCE TO RELATED APPLICATIONS

This application claims benefit under 35 U.S.C. §119(e) of U.S. Provisional Application Ser. No. 61/889,754, filed Oct. 11, 2013, which is incorporated herein by reference in entirety.

BACKGROUND

Three-phase current source rectifier (CSR) (also sometimes referred to as a "buck-type rectifier") may feature a step-down function, smaller filter size, inrush current limiting capability, and the potential to achieve high efficiency. It may be applied as the active front-end in high-efficiency power supplies for telecommunication and data center, where 480 V or 380 V ac voltage was stepped down to 400 V dc voltage in a single conversion stage. It may be used as the off-board dc fast charger for electric vehicles to increase the efficiency. In high power applications such as DC arc furnace and induction melting, CSRs may largely reduce the size, loss and cost of the transformer and harmonic filter. For variable speed motor drive application, it may reduce the input filter size and increase the power density.

The switches in CSRs may be Reverse Blocking Insulated-Gate Bipolar Transistor (RB-IGBT) with reverse-blocking capability to operate under AC voltage. The RB-IGBT was developed to reduce the conduction loss for current source converters and matrix converters. But the switching loss of RB-IGBT may be much higher compared with standard IGBTs, due to its longer "tail current", worse voltage overshoot and larger reverse recovery current. A symmetric gate-commutated thyristor (GCT) may have a blocking voltage of several kVs and may be used in high-voltage application with less than 1 kHz switching frequency. In most applications of pulse width modulated (PWM) CSRs, the switches may be formed by connecting an active device (IGBT, MOSFET or JFET) with a diode in series. Even with several devices in parallel in one switch, the high conduction/current loss may still account up to 50% of the total converter loss in traditional CSRs.

Therefore, there is a need for an improved CSR with lower conduction loss without significantly increasing the size of devices in the CSR.

DETAILED DESCRIPTION

Figure 1:
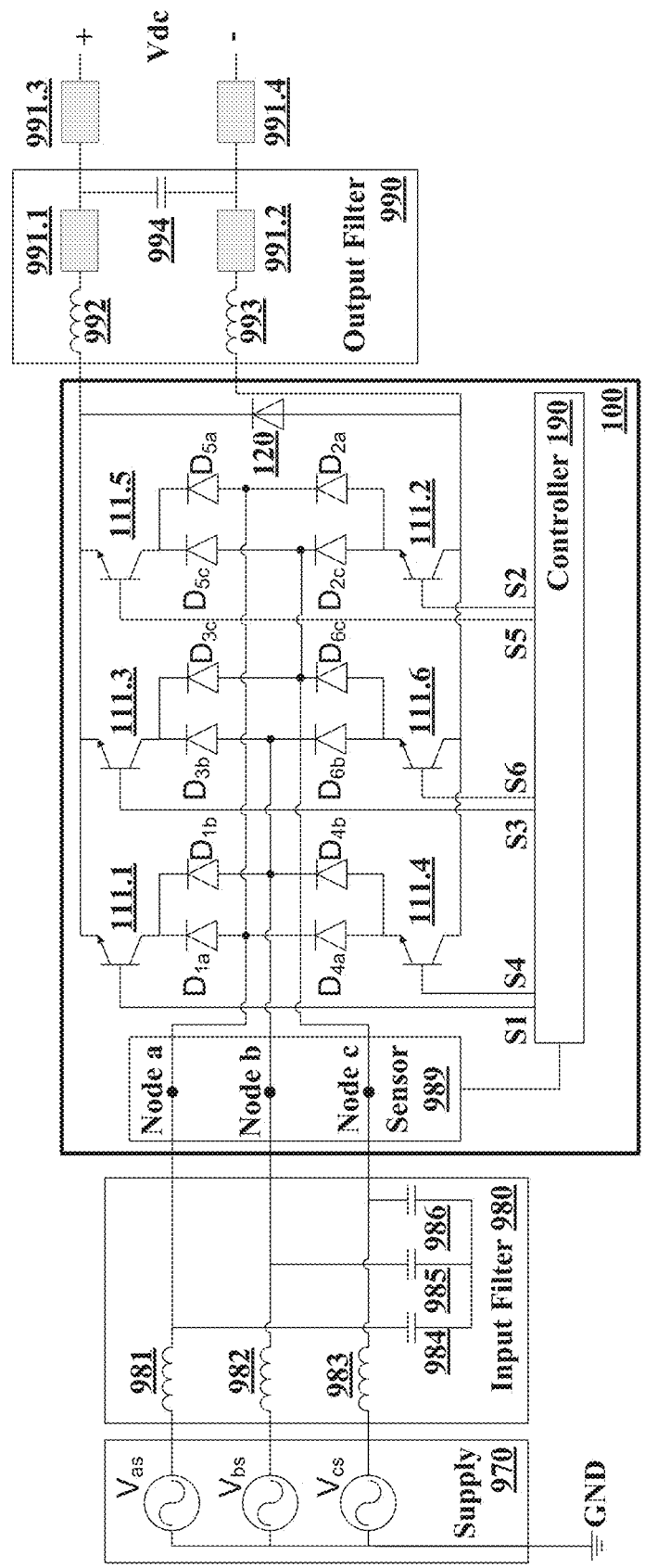
FIG. 1 illustrates a converter with a CSR according to an embodiment of the present disclosure.

According to an embodiment of the present disclosure in FIG. 1, a three-phase current source rectifier (CSR) 100 with three AC inputs may include a controller 190, a free-wheeling diode 120 with a cathode connected to a positive line and an anode connected to a negative line, three pairs of switches 111.1-111.6 (also referred to as $S_1$-$S_6$) connected in parallel between the positive line and the negative line, and six pairs of diodes ($D_{1a}$, $D_{4a}$) ($D_{1b}$, $D_{4b}$) ($D_{3b}$, $D_{6b}$) ($D_{3c}$, $D_{6c}$) ($D_{5c}$, $D_{2c}$) ($D_{5a}$, $D_{2a}$), each pair of the diodes connected in series. Each two pairs of the diodes may be connected in parallel with each other and in series with a respective pair of switches. Each AC input may be connected to between each of two pairs of the diodes.

A converter system may include at least one three-phase CSR 100.

The controller 190 may include a processor, a Space Vector Modulator (SVM), a memory storing instructions and historical performance data of the converter, A/D converters, digital signal processor (DSP), etc. (not shown).

The free-wheeling diode 120 may have a cathode connected to the positive line and an anode connected to the negative line, so that current may only flow from the negative line to the positive line through the free-wheeling diode 120.

A supply 970 may generate 3 AC supply voltages Vas, Vbs, Vcs, (480 volts AC) relative to a ground GND. An input filter 980 may include 3 inductors 981-983 to generate three AC inputs (Va, Vb, and Vc). Each of the three AC inputs (Va, Vb, and Vc) nodes may be connected to a respective capacitor 984-986 to a common node. An output filter 990 may include a positive inductor 992, a negative inductor 993, and a DC capacitor 994.

Each of the switches 111.1-111.6 may be controlled by a corresponding control signal S1-S6 from the controller 190. A first pair of the diodes ($D_{1a}$, $D_{4a}$) and a second pair of the diodes ($D_{1b}$, $D_{4b}$) may be connected in parallel with each other and in series between a first pair of switches 111.1 and 111.4. A third pair of the diodes ($D_{3b}$, $D_{6b}$) and a fourth pair of the diodes ($D_{3c}$, $D_{6c}$) may be connected in parallel with each other and in series between a second pair of switches 111.3 and 111.6. A fifth pair of the diodes ($D_{5c}$, $D_{2c}$) and a sixth pair of the diodes ($D_{5a}$, $D_{2a}$) may be connected in parallel with each other and in series between a third pair of switches 111.5 and 111.2.

A first AC input (Va) of the three AC inputs may be connected between the first pair of the diodes ($D_{1a}$, $D_{4a}$) and between the sixth pair of the diodes ($D_{5a}$, $D_{2a}$). That is, Va may be connected to the anode of $D_{1a}$ and the cathode of $D_{4a}$, and connected to the anode of $D_{5a}$ and the cathode of $D_{2a}$. A second AC input (Vb) of the three AC inputs may be connected between the second pair of the diodes ($D_{1b}$, $D_{4b}$) and between the third pair of the diodes ($D_{3b}$, $D_{6b}$). That is, Vb may be connected to the anode of $D_{1b}$ and the cathode of $D_{4b}$, and connected to the anode of $D_{3b}$ and the cathode of $D_{6b}$. A third AC input (Vc) of the three AC inputs may be connected between the fourth pair of the diodes ($D_{3c}$, $D_{6c}$) and between the fifth pair of the diodes ($D_{5c}$, $D_{2c}$). That is, Vc may be connected to the anode of $D_{3c}$ and the cathode of $D_{6c}$, and connected to the anode of $D_{5c}$ and the cathode of $D_{2c}$.

With appropriate control signal sequences to control signals S1-S6, at any specific biasing conditions, the controller 190 may control the switches 111.1-111.6 to conduct current through two of the switches (out of the 3 switches 111.1, 111.3, 111.5 connected to the positive line) to the positive line and to conduct current through two different switches (out of the 3 switches 111.2, 111.4, 111.6 connected to the negative line) from the negative line. In this fashion, the CSR 100 may spread out the current between 2 switches at any biasing condition, thus, reduce the power loss in CSR 100 without the need to increase device sizes.

Each of the switches 111.1-111.6 may include a bipolar junction transistor (BJT). Other switching devices, such as metal-oxide-semiconductor field effect transistors (MOSFETs), junction field effect transistors (JFETs), etc, may also be used. Each of the switches 111.1-111.6 may be controlled by the controller 190 based upon the three AC inputs (Va, Vb, and Vc).

Figures 3A, 3B:
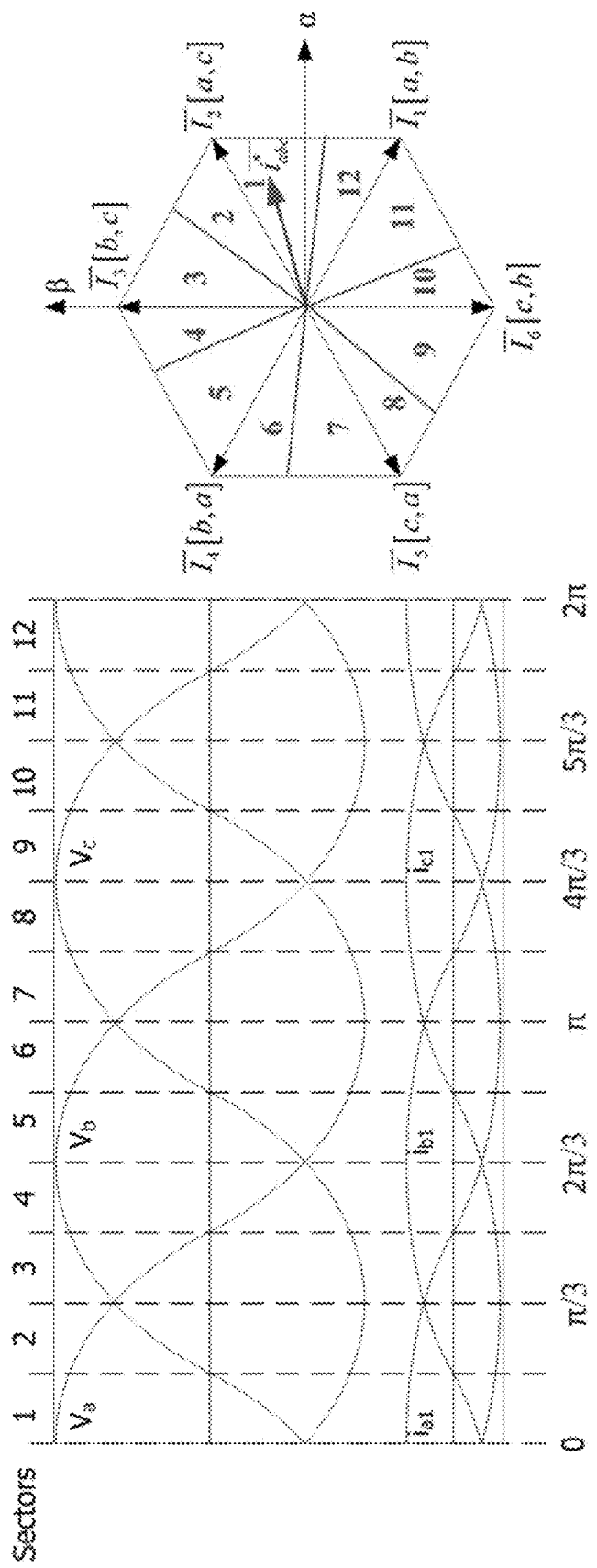
FIG. 3A illustrates a plot of a three-phase AC supply's voltages as divided into twelve phase sectors in a single cycle of the three-phase AC supply according to an embodiment of the present disclosure.
FIG. 3B illustrates a control vector space diagram of a CSR according to an embodiment of the present disclosure.

The controller 190 may determine a present phase sector from a plurality of phase sectors of the three AC inputs (Va, Vb, and Vc) (as illustrated for example in FIG. 3B). A sensor 989 may measure voltages of the three AC inputs (Va, Vb, and Vc). Output sensors 991.1-991.4 may measure output current (DC inductor current) and voltage (DC capacitor voltage). The controller 190 may generate control signal sequences to selectably turn on or off the switches 111.1-111.6, based upon the measurements by the sensor 989 and/or output sensors 991.1-991.4. The controller 190 may control the switches 111.1-111.6 to conduct current through two of the switches to the positive line and to conduct current through two different switches from the negative line. The controller 190 may control the duration of the control signal sequences based upon the voltage of the three AC inputs (Va, Vb, and Vc).

At least one of the switches 111.1-111.6, the diodes ($D_{1a}$, $D_{4a}$) ($D_{1b}$, $D_{4b}$) ($D_{3b}$, $D_{6b}$) ($D_{3c}$, $D_{6c}$) ($D_{5c}$, $D_{2c}$) ($D_{5a}$, $D_{2a}$), and the free-wheeling diode 120 may be a wide-band gap (WBG) device, such as a Silicon Carbide based device. At least one of the diodes ($D_{1a}$, $D_{4a}$) ($D_{1b}$, $D_{4b}$) ($D_{3b}$, $D_{6b}$) ($D_{3c}$, $D_{6c}$) ($D_{5c}$, $D_{2c}$) ($D_{5a}$, $D_{2a}$) and the free-wheeling diode 120 may be a Schottky diode.

Figure 2:
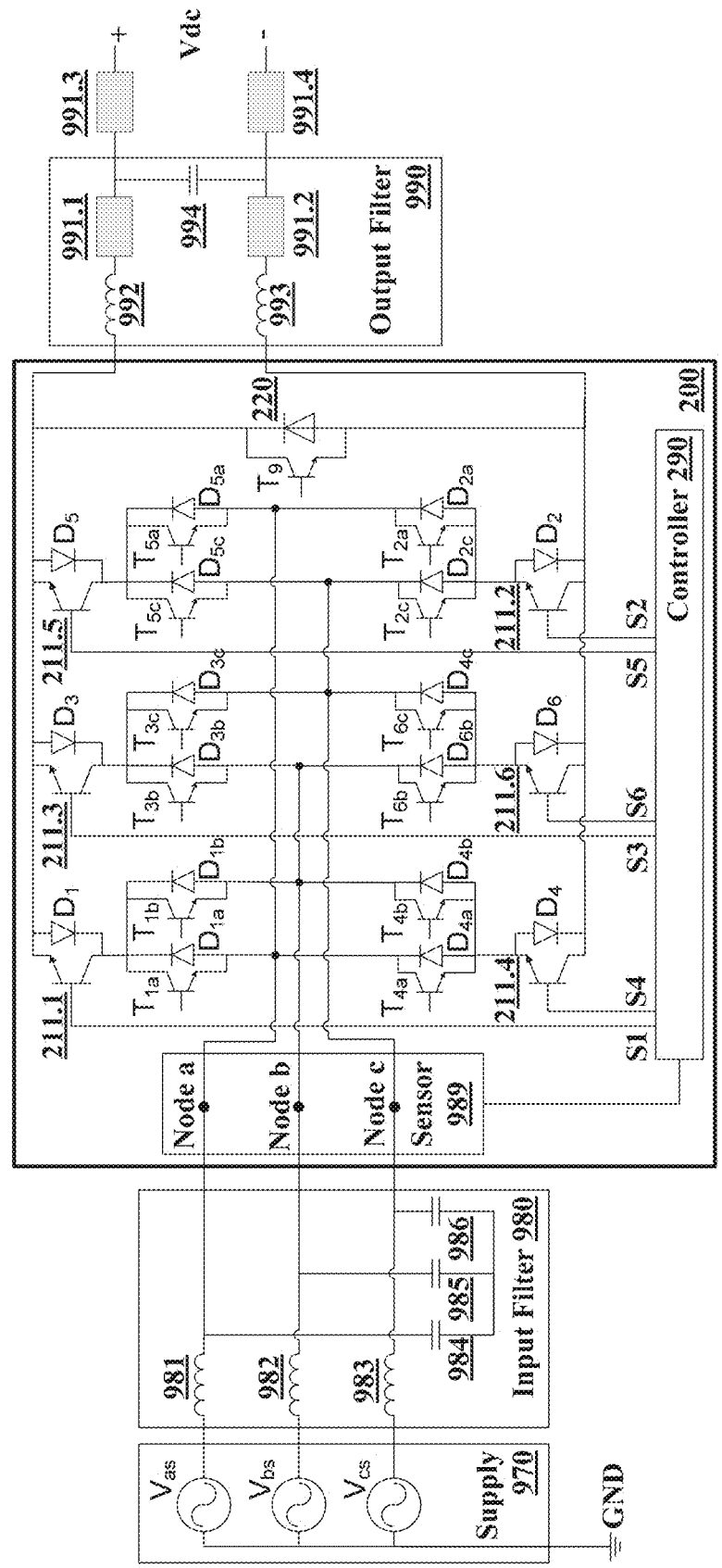
FIG. 2 illustrates another converter with a CSR according to an embodiment of the present disclosure.

According to another embodiment of the present disclosure in FIG. 2, a three-phase current source rectifier (CSR) 200 with three AC inputs may include a controller 290, a free-wheeling diode 220 with a cathode connected to a positive line and an anode connected to a negative line, three pairs of switches 211.1-211.6 connected in parallel between the positive line and the negative line, and six pairs of diodes ($D_{1a}$, $D_{4a}$) ($D_{1b}$, $D_{4b}$) ($D_{3b}$, $D_{6b}$) ($D_{3c}$, $D_{6c}$) ($D_{5c}$, $D_{2c}$) ($D_{5a}$, $D_{2a}$), each pair of the diodes connected in series. Each two pairs of the diodes may be connected in parallel with each other and in series with a respective pair of switches. Each AC input may be connected to between each of two pairs of the diodes.

The CSR 200 may additionally include diodes $D_1$-$D_6$, each connected in parallel with a corresponding switch 211.1-211.6. The CSR 200 may additionally include a switch $T_9$ connected in parallel with the free wheeling diode 220.

The CSR 200 may additionally include reverse biasing switches ($T_{1a}$, $T_{4a}$) ($T_{1b}$, $T_{4b}$) ($T_{3b}$, $T_{6b}$) $T_{6c}$) ($T_{5c}$, $T_{2c}$) ($T_{5a}$, $T_{2a}$) each connected in parallel with a corresponding diode ($D_{1a}$, $D_{4a}$) ($D_{1b}$, $D_{4b}$) ($D_{3b}$, $D_{6b}$) ($D_{3c}$, $D_{6c}$) ($D_{5c}$, $D_{2c}$) ($D_{5a}$, $D_{2a}$). The reverse biasing switches ($T_{1a}$, $T_{4a}$) ($T_{1b}$, $T_{4b}$) ($T_{3b}$, $T_{6b}$) ($T_{3c}$, $T_{6c}$) ($T_{5c}$, $T_{2c}$) ($T_{5a}$, $T_{2a}$) may be controlled by the controller 290 (connections not shown). The CSR 200 may be considered as a "bidirectional" CSR. That is, CSR 200 may be controlled similarly to CSR 100, and CSR 200 may be additionally controlled via reverse biasing switches ($T_{1a}$, $T_{4a}$) ($T_{1b}$, $T_{4b}$) ($T_{3b}$, $T_{6b}$) ($T_{3c}$, $T_{6c}$) ($T_{5c}$, $T_{2c}$) ($T_{5a}$, $T_{2a}$), to allow current to flow back to the three AC inputs (Va, Vb, and Vc). In this fashion, CSR 200 may be used to reverse current supply from the DC output back to the three-phase AC inputs.

According to the embodiments in the present disclosure, the new three-phase CSR, referred as Delta-type Current Source Rectifier (DCSR), may reduce the device conduction loss.

As shown in FIG. 1, the three legs in the CSR 100 may be connected in delta type on the input side. Each leg includes two active switches and a diode bridge connected with two phases. In this way, the dc-link current may be shared by multiple switches during operation to reduce the device conduction loss. Although six pairs of diodes may be present in CSR 100, the current rating of each diode may be only half of total current. The freewheeling diode 120 may be used to further reduce the conduction loss in CSR 100. Since the output voltage must be positive, the energy may only be transferred unidirectionally in CSR 100 in FIG. 1. With the bidirectional CSR 200 in FIG. 2, the energy may be transferred in both directions.

For the analysis of the CSR 100, its input voltages $v_a$, $v_b$ and $v_c$ (in FIG. 3A) and the fundamental components $i_{a1}$, $i_{b1}$ and $i_{c1}$ of its input currents may be defined in (1), where $V_m$ and $I_m$ may be the peak values of the sinusoidal voltage and current respectively, $\omega$ may be the mains angular frequency and $\phi$ may be the phase difference between $v_a$ and $i_{a1}$.

$$\begin{cases} v_a = V_m\cos(\omega t + \varphi) \\ v_b = V_m\cos\left(\omega t - \frac{2\pi}{3} + \varphi\right), \\ v_c = V_m\cos\left(\omega t + \frac{2\pi}{3} + \varphi\right) \end{cases} \begin{cases} i_{a1} = I_m\cos(\omega t) \\ i_{b1} = I_m\cos\left(\omega t - \frac{2\pi}{3}\right) \\ i_{c1} = I_m\cos\left(\omega t + \frac{2\pi}{3}\right) \end{cases} \quad (1)$$

According to the relationship between the input voltage and current, 12 sectors may be divided in FIG. 3A for CSR 100. On the space vector plane in FIG. 3B, the input current space vector $$\vec{i}^*_{abc} = \sqrt{\frac{2}{3}}\left(i_{a1} + i_{b1}e^{j\frac{2\pi}{3}} + i_{c1}e^{j\frac{-2\pi}{3}}\right) = \sqrt{\frac{3}{2}}I_m e^{j\omega t}$$

may be synthesized by six active space vectors $\vec{T}_x$, x=1, . . . , 6 and a zero vector $\vec{T}_0$. [x, y], x, y=a, b, c denotes that the switches connected with phase x and phase y may be carrying the dc-link current in a space vector. Considering both the switching loss and modulation index range, $i^*_{abc}$ may be composed by two consecutive active vectors and the zero vector in each sector. In the following analysis, Sector 12 ($-\pi/6 \leq \omega t < -\phi$, $V_a > V_c > V_b$) will be selected as an example to demonstrate the operation principle of CSR 100.

For a CSR 100 in Sector 12, according to the relationship of the input voltages, the diode bridge in each leg will clamp the higher phase voltage to its positive bus, while clamp the lower phase voltage to its negative bus. For example, the diode $D_{1b}$ may be blocked and $D_{1a}$ may be conducting since $V_a > V_b$. Similarly, $D_{4a}$ may be off and $D_{4b}$ may be on.

Figure 5:
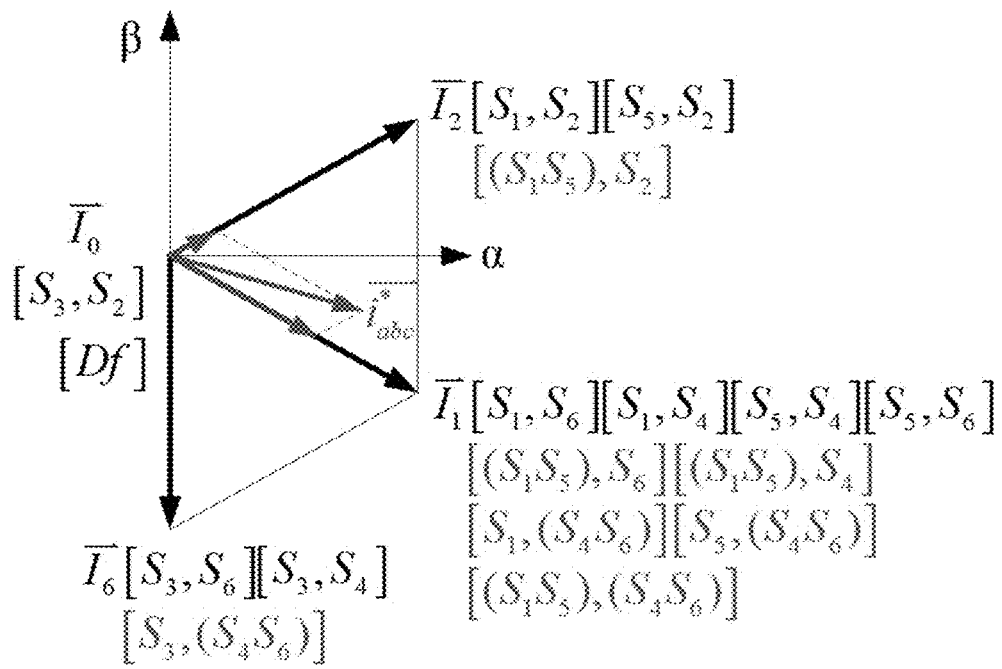
FIG. 5 illustrates different conduction states in phase sector 12 for a CSR according to an embodiment of the present disclosure.

There may be more conduction states in CSR 100 than traditional CSRs. In Sector 12, there may be nine conduction states for the space vector $\vec{T}_1$ in FIG. 5. $[S_x, S_y]$, x, y=1, . . . , 6 indicates the on state of the switches Sx and Sy in the conduction state. In CSR 100, many conduction states involve three or four switches.

Figure 4:
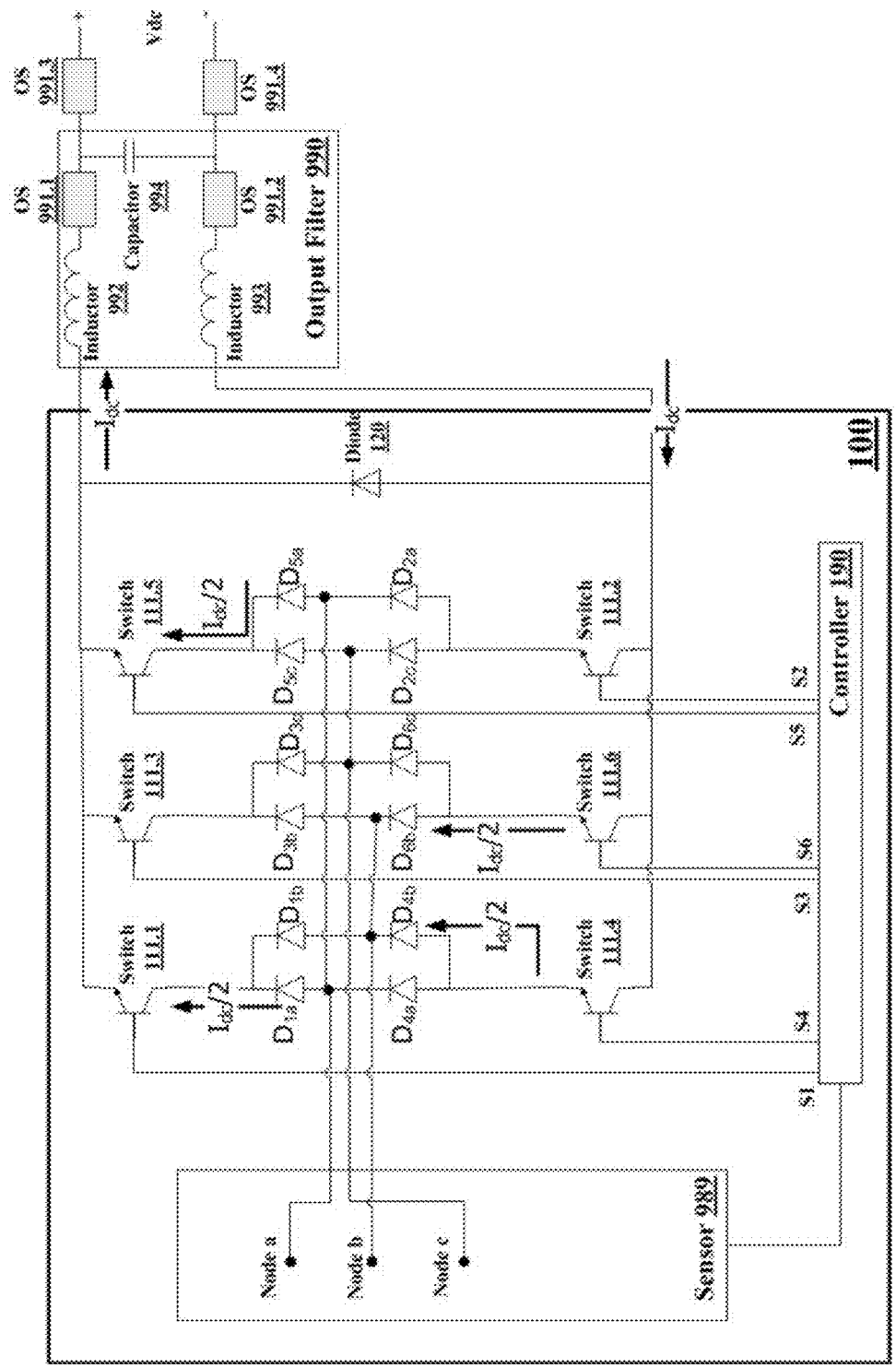
FIG. 4 illustrates current flow in a CSR according to an embodiment of the present disclosure.
Figure 6:
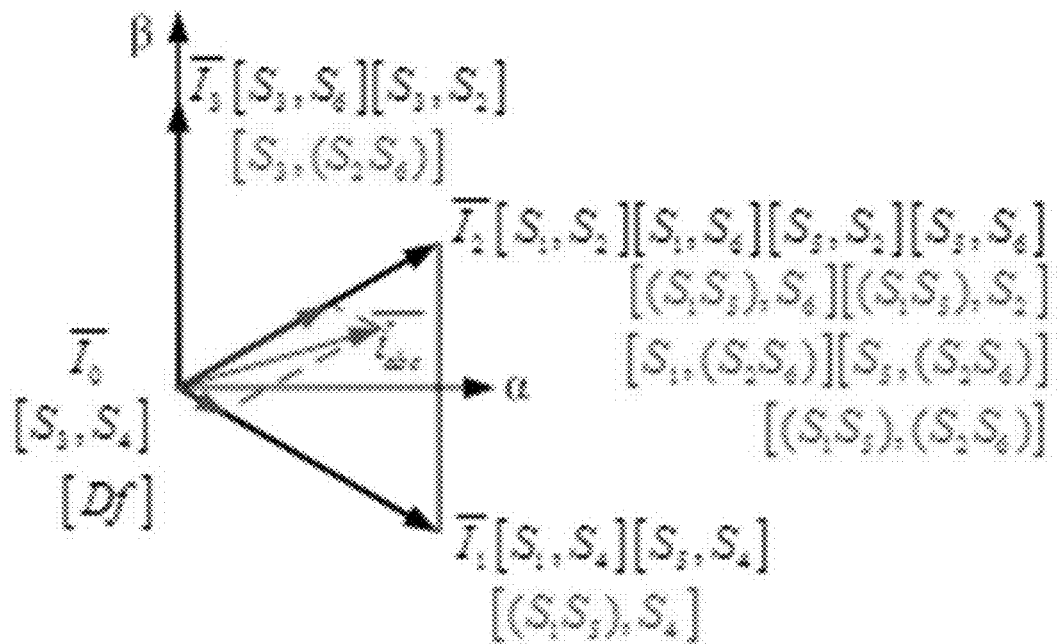
FIG. 6 illustrates different conduction states in phase sector 1 for a CSR according to an embodiment of the present disclosure.

The current path may be shown in FIG. 4 for the conduction state $[(S_1S_5), (S_4S_6)]$ of the space vector $\vec{T}_1$. In this state, both switch 111.1 and switch 111.5 may be turned on to share the current in phase a, and both switch 111.4 and switch 111.6 may be turned on to share the current in phase b. The conduction states will change in different sectors accordingly with input voltages. In Sector 1 ($-\phi \leq \omega t < \pi/6$, $V_a > V_b \geq V_c$), the conduction states may be shown in FIG. 6, which may be different from those in Sector 12.

Modulation Schemes

The "3-switch" and "4-switch" space vector modulation schemes, which contain three and four commutations in a switching period respectively, may be used in the embodied CSRs using "Modified Fullwave Symmetrical Modulation (MFSM)". The space vectors in MFSM may be arranged to make the switching voltage the lowest, so that the switching loss may be assumed to be minimum. The modulation scheme may be characterized through its output voltage $v_{pn}$ and input currents $i_a$, $i_b$ and $i_c$ such as in FIG. 7.

Figure 7:
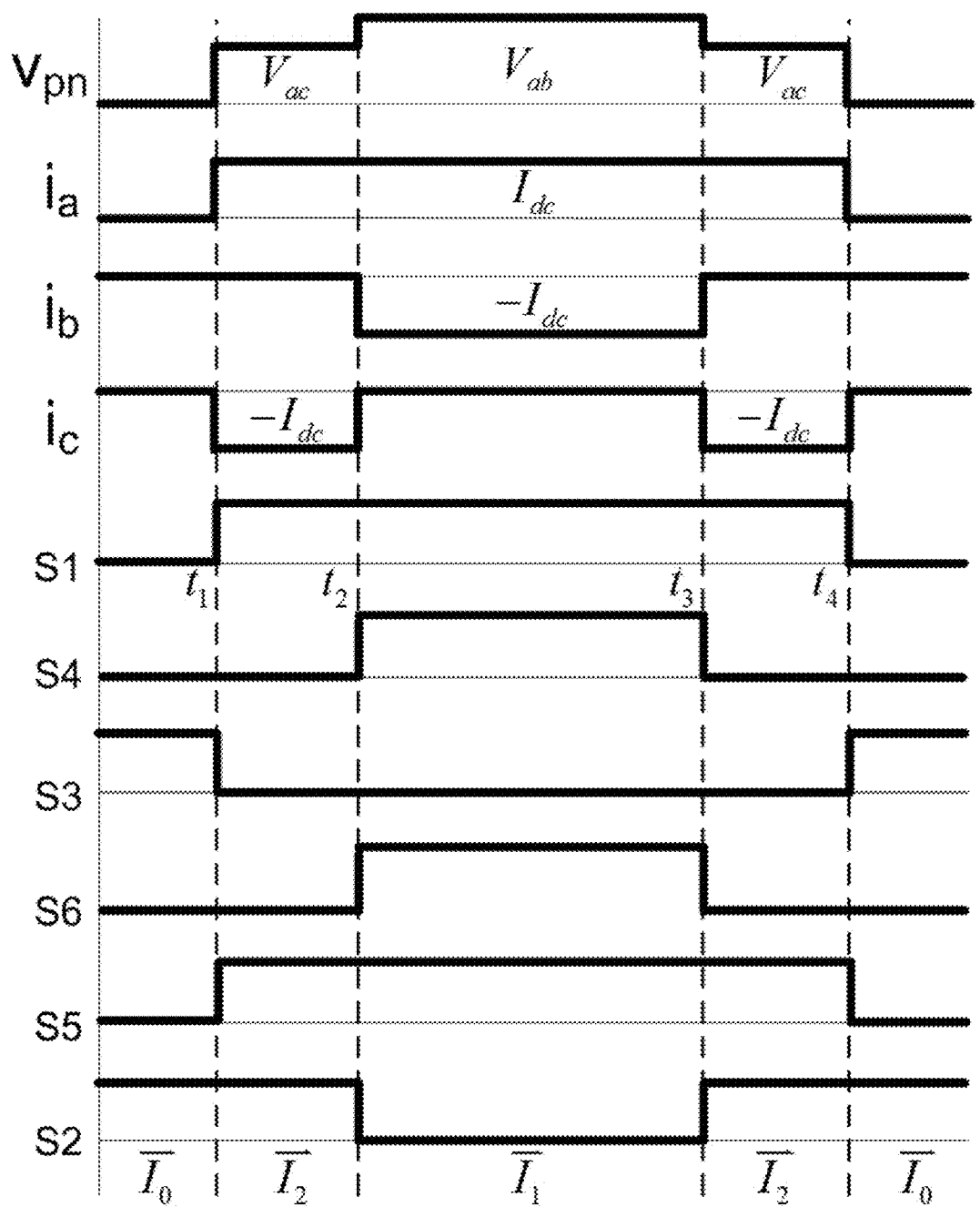
FIG. 7 illustrates exemplary modulation scheme of a CSR in a switching period Ts for phase sector 12, according to an embodiment of the present disclosure.

The modulation scheme of CSR 100 in Sector 12 for minimum conduction loss may be demonstrated in FIG. 7. To reduce the conduction loss of the converter, it may be recommended to use as many devices as possible to share the dc-link current. So the conduction state $[(S_1S_5), (S_4S_6)]$ may be selected for the space vector $\vec{T}_1$ instead of $[S_1, S_6]$, and $[(S_1S_5), S_2]$ may be chosen for $\vec{T}_2$ to replace $[S_1, S_2]$. The switching loss will not change much if the switching energy may be assumed to be proportional to the product of the switching voltage and current. At moment $t_1$, switch 111.1 and switch 111.5 may be turned off simultaneously. Since they each carry only half dc-link current, the total switching energy in CSR 100 may not increase significantly if at all.

Design of CSR

The input voltage on the input capacitors with capacitance $C_s$ may be assumed to be pure sinusoidal, as defined in equation (1). The fundamental-frequency component of the input current of CSR 100 has a phase difference $\phi$ from the $C_s$ voltage, as defined in equation (1). The load current may be constant dc current $I_{dc}$ and the load voltage may be constant dc voltage $V_{dc}$. The switching frequency $f_s$ may be assumed to be much higher than the line frequency f. The switching energy has a linear relationship with respect to the product of the operating voltage $v_s$ and current $i_s$. The turn-on energy $E_{on}=k_{on}|v_s i_s|$. The turn-off energy $E_{off}=k_{off}|v_s i_s|$.

1) For Switch 111.1:

The maximum voltage stress $V_{S_1max}$ on the switches in CSR 100 may be the maximum line-to-line input voltage $V_{l-l,max}$, which may be given by $$V_{S_1,max,DCSR} = V_{l-l,max} = \sqrt{3}V_m \quad (2)$$

The modulation index may be defined as $$M = \frac{I_m}{I_{dc}} = \frac{2V_{dc}}{3V_m\cos\varphi}.$$

If the freewheeling diode 120 may be added to freewheel current during zero vector, the current stress of the switch may be given by $$I_{S_1,avg,DCSR} = \frac{I_{dc}M}{\pi} \quad (3)$$

$$I_{S_1,rms,DCSR} = I_{dc}\sqrt{\frac{M(4-\sqrt{3}\cos\varphi)}{4\pi}}$$

With the derived rms and average currents, the conduction loss of switch 111.1 may be given by (4), where $V_{S_1,on}$ and $R_{S_1,on}$ may be the threshold voltage and the on resistance of switch 111.1 respectively.

$$P_{S_1,conduction,DCSR} = I_{S_1,avg,DCSR}V_{S_1,on} + I_{S_1,rms,DCSR}^2 R_{S_1,on} \quad (4)$$

The switching loss of switch 111.1 in CSR 100 may be given by (5), which may be the same as the one of the traditional CSR.

$$P_{S_1,switching,DCSR} = \frac{\sqrt{3}V_m f_s I_{dc}(k_{on}+k_{off})}{2\pi} \quad (5)$$

2) For Branch Diodes D1a and D1b:

The maximum voltage stress on the branch diodes may be the maximum line-to-line ac voltage $V_{l-l,max}$ in (2). If the freewheeling diode 120 may be added to freewheel current during zero vector, the current stress of the branch diodes may be given by $$I_{D_{1a},avg,DCSR} = \frac{I_{dc}M(2-\sin\varphi)}{4\pi} \quad (6)$$

$$I_{D_{1a},rms,DCSR} = I_{dc}\sqrt{\frac{M(4-\sqrt{3}\cos\varphi - 2\sin\varphi)}{8\pi}}$$

$$I_{D_{1b},avg,DCSR} = \frac{I_{dc}M(2+\sin\varphi)}{4\pi}$$

$$I_{D_{1b},rms,DCSR} = I_{dc}\sqrt{\frac{M(4-\sqrt{3}\cos\varphi + 2\sin\varphi)}{8\pi}}$$

With the derived rms and average currents, the conduction loss of the branch diode may be given by (7), where $V_{D,on}$ and $R_{D,on}$ may be the threshold voltage and the on resistance of the branch diode.

$$P_{D,conduction,DCSR} = I_{D_{1a}/D_{1b},avg,DCSR}V_{D,on} + I_{D_{1a}/D_{1b},rms,DCSR}^2 R_{D,on} \quad (7)$$

As shown in (6), the current stress may be different on the two branch diodes, and may be closely related with the phase angle $\varphi$. As $\varphi$ deviates from zero, the range of each sector in the space vector plane will change, impacting the conduction time of the two branch diodes. When $\varphi$>0, D1a has smaller current stress than D1b. Otherwise, D1b has smaller current stress. To show the difference of the current stresses on D1a and D1b, two parameters may be defined as $$k_{D,rms} = \frac{I_{D_{1a},rms,DCSR}^2}{I_{D_{1b},rms,DCSR}^2} \quad (8)$$

$$k_{D,avg} = \frac{I_{D_{1a},avg,DCSR}}{I_{D_{1b},avg,DCSR}}$$

3) For Freewheeling Diode 120:

The maximum voltage stress on the freewheeling diode may be the maximum line-to-line ac voltage $V_{l-l,max}$ in (2). The average and rms currents of free wheeling diode 120 may be given by $$I_{Df,avg,DCSR} = I_{dc} - \frac{3I_{dc}M}{\pi} \quad (9)$$

$$I_{Df,rms,DCSR} = I_{dc}\sqrt{1 - \frac{3M}{\pi}}$$

With the derived rms and average currents, the conduction loss of the freewheeling diode may be given by (10), where $V_{Df,on}$ and $R_{Df,on}$ may be the threshold voltage and the on resistance of the freewheeling diode respectively.

$$P_{Df,conduction,DCSR} = I_{Df,avg,DCSR}V_{Df,on} + I_{Df,rms,DCSR}^2 R_{Df,on} \quad (10)$$

Compared with the traditional CSR, CSR 100 may reduce the rms current of the switch dramatically. To compare the rms currents of switch 111.1 in two topologies, the parameter $k_{S_1,rms,DCSR \; vs \; CSR}$ may be defined in (11), where $I_{S_1,rms,DCSR}$ and $I_{S_1,rms,CSR}$ may be the rms currents of switch 111.1 in CSR 100 and the traditional CSR respectively.

$$k_{S_1,rms,DCSR \; vs \; CSR} = \frac{I_{S_1,rms,DCSR}^2}{I_{S_1,rms,CSR}^2} \quad (11)$$

When the freewheeling diode 120 is added, $k_{S_1,rms,DCSR \; vs \; CSR}$ may be only related with $\varphi$. The rms current may be reduced by up to 25% in CSR 100 when $\varphi$=0.

To compare the rms currents of the branch diode in two topologies, the parameter $k_{D,rms,DCSR \; vs \; CSR}$ may be defined in (12), where $I_{D_{1a},rms,DCSR}$ and $I_{D_{1b},rms,DCSR}$ may be the rms currents of D1a and D1b respectively in CSR 100, and $I_{D_1,rms,CSR}$ may be the rms current of D1 in the traditional CSR.

$$k_{D,rms,DCSR \; vs \; CSR} = \frac{I_{D_{1a},rms,DCSR}^2 + I_{D_{1b},rms,DCSR}^2}{I_{D_1,rms,CSR}^2/2} \quad (12)$$

When the freewheeling diode 120 is added, $k_{D,rms,DCSR \; vs \; CSR}$ may be only related with $\varphi$. The rms current may be increased on the branch diodes by 13% in CSR 100 when $\varphi$=0.

Based on the previous analysis, the conduction loss of the semiconductor devices may be calculated under different operation conditions. The comparison conditions may be listed in Table I. The 1200V SiC Schottky diode from CREE may be selected as the branch or the freewheeling diode. The switches may be realized with either 1200V SiC MOSFET from CREE or 1200V Si Trench and Fieldstop IGBT from Infineon. The two topologies will be compared with the same semiconductor chip area.

TABLE I

CONDITIONS FOR CONDUCTION LOSS COMPARISON

| Topology | CSR 100 | Traditional CSR |
|---|---|---|
| Output power | 0-100 kW | |
| Input voltage | 480 Vac, 60 Hz | |
| Modulation index | 0-1 | |
| Phase angle $\varphi$ | $-\pi/6 - \pi/6$ | |

To generalize the comparison to different power ratings, the chip area may be assumed to have linear relationship with the current rating of the devices. Based on the datasheets provided by the semiconductor manufacturer, the relationship may be derived by (13), where $A_{Si \; IGBT, \; 1200V}$ may be the chip area of Si IGBT, $A_{SiC \; MOSFET, \; 1200V}$ may be the chip area of SiC MOSFET, $A_{SiC \; diode, \; 1200V}$ may be the chip area of SiC Schottky diode, and $I_N$ may be the device current rating.

$$A_{Si \; IGBT, 1200V} = (0.95I_N + 3.2) \; mm^2$$

$$A_{SiC \; MOSFET, 1200V} = (0.52I_N) \; mm^2$$

$$A_{SiC \; diode, 1200V} = (0.45I_N + 0.59) \; mm^2 \quad (13)$$

In the calculation, the threshold voltages of the Si IGBT and SiC Schottky diode do not change with the device rating. The on resistance of the device may be inversely proportional to its chip area. The voltage drop $V_{on}$ of the device may be given by (14), where $V_o$ may be the threshold voltage, i may be the device current, $R_o$ may be the on resistance when the chip area may be and $R_{o,N}$ may be the on resistance when the chip area may be $A_N$.

$$V_{on} = V_o \cdot i + i^2 \cdot R_o, \quad (14)$$

$$R_o = \frac{R_{o,N} \cdot A_N}{A}$$

The conduction loss of the device may be calculated, which may be related with the output power level, modulation index and the phase angle φ. CSR 100 may have 10% to 15% less conduction loss than the traditional CSR when Si IGBT are applied as the switches. If SiC MOSFET may be applied as the switch, the savings on the conduction loss in CSR 100 may reach 15% to 20% because SiC MOSFETs do not have threshold voltage.

Experimental Verification

As shown in FIG. 19, a 7.5 kW prototype was built with the specifications in Table II. The size of the prototype may be 9.1 in (L)×6.9 in (W)×5.0 in (H). The semiconductor devices and passive components used in the prototype may be listed in Table III. 1200 V/20 A SiC MOSFETs and 1200 V/18 A SiC Schottky diodes may be applied as the switches and diodes respectively in the prototype for their low on resistance and switching loss.

TABLE II

Specification of CSR 100

| | |
|---|---|
| Output power | 7.5 kW |
| Input voltage | 480 Vac, |
| Input | 110 μH |
| Input | 6.8 μF each |
| Output | 400 Vdc |
| Output | 150 μF |
| Switching | 28 kHz |

TABLE III

DEVICE AND PASSIVE COMPONENTS

| Component | Description |
|---|---|
| Switches | SiC MOSFET, 1200 V/20 A, C2M0080120D, CREE |
| Branch and freewheeling diodes | SiC Schottky diode, 1200 V/18 A, C4D10120D, CREE |
| Input inductor | 110 μH, Ferrite R, EE core, 0R45724EC, Magnetics, 13 turns of AWG#12 wire |
| Input capacitor | 6.8 μF/330 Vac, film, B32916A3685, EPCOS |
| DC-link inductor | 1.9 mH, Nanocrystalline, C core, MK Magnetics 42 turns of copper foil (cross section area = 12.9 mm²) |
| Output capacitor | 3 × 50 μF/450 Vdc, film, B32776G4506, EPCOS |

Figure 8:
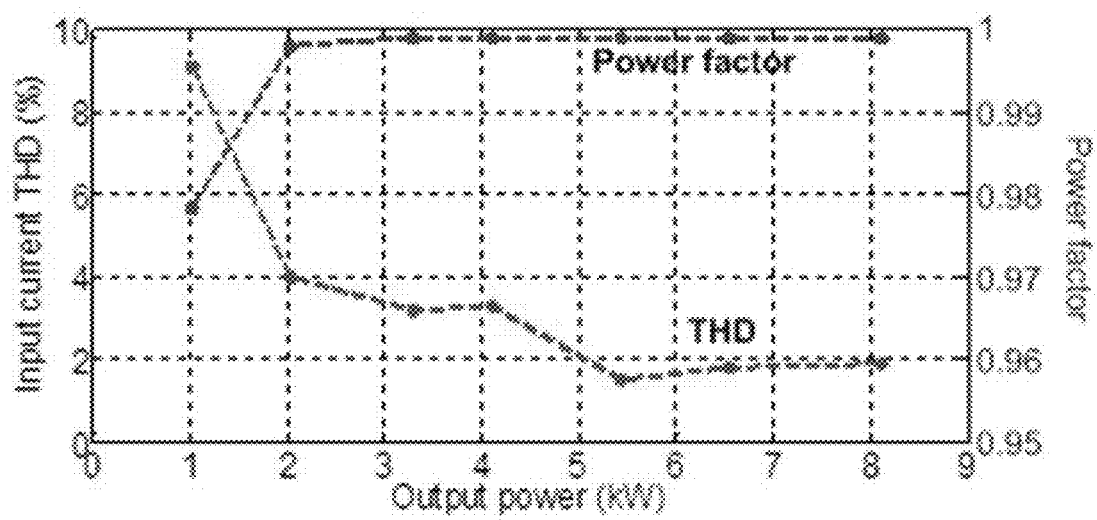
FIG. 8 illustrates input current THD and power factor of CSR, according to an embodiment of the present disclosure.

The input current total harmonic distortion (THD) and the power factor may be shown in FIG. 8 under different output power levels. CSR 100 may achieve unity power factor and low input harmonics in most of the power range.

Figure 9:
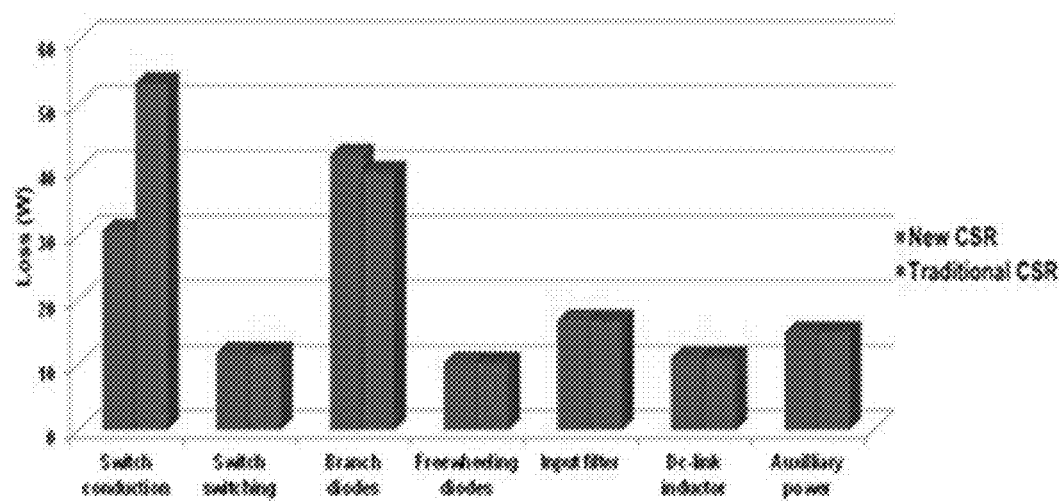
FIG. 9 illustrates calculated loss breakdown comparing a CSR performance, according to an embodiment of the present disclosure.

The semiconductor device loss of CSR 100 and the traditional CSR may be calculated based on the analysis in the previous sections. The loss of passive components may be calculated. The loss breakdown of the two topologies may be shown in FIG. 9 according to the calculation under 7.5 kW output power. CSR 100 may save much conduction loss of the switches while keep other parts of loss comparable to the traditional CSR.

The efficiency of both topologies may be measured with YOKOGAWA power analyzer PZ4000 and compared with the calculated efficiency under different output power. CSR 100 has higher efficiency over the whole power range.

Figure 10:
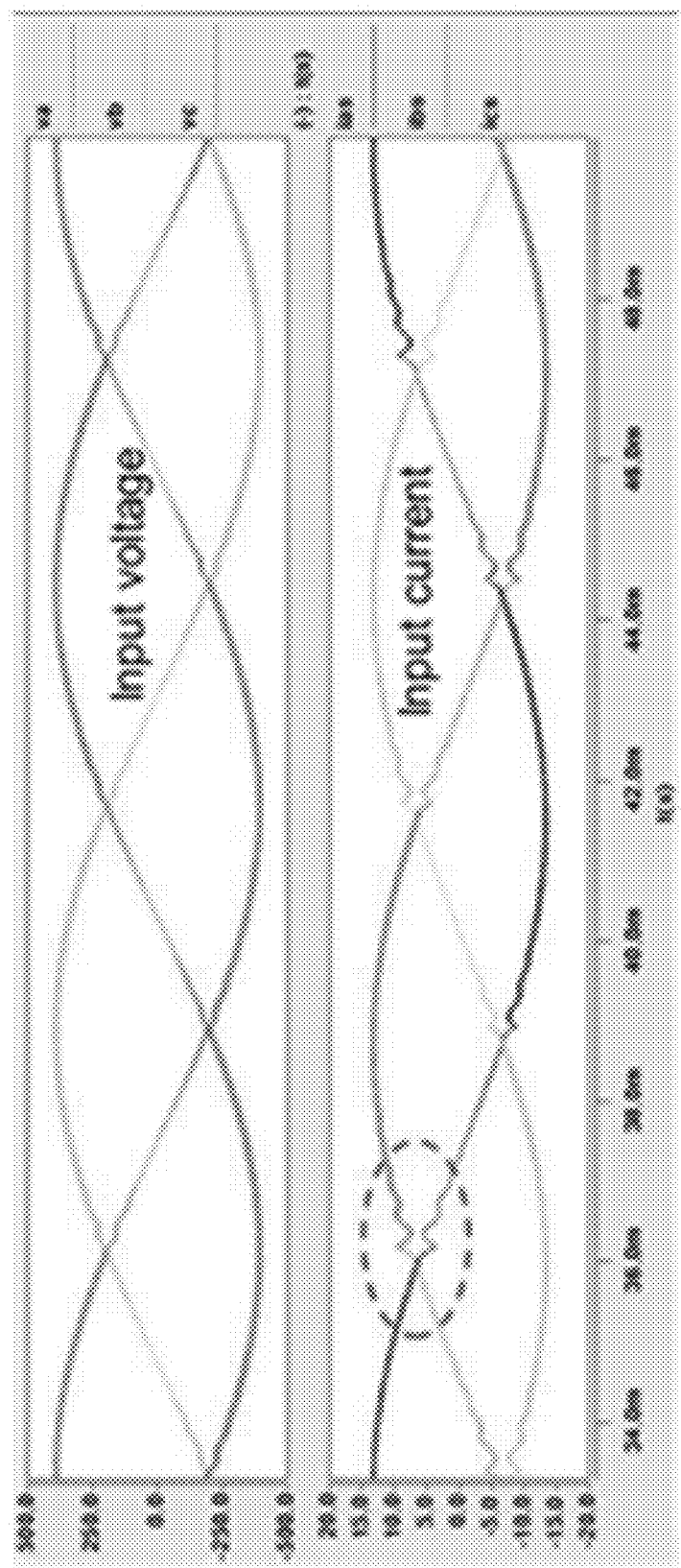
FIG. 10 illustrates simulated distortion in waveforms of a CSR, according to an embodiment of the present disclosure.

By keeping the same arrangement of the space vectors and applying new conduction states, MFSM may be easily transformed to a high-efficiency modulation for CSR 100. However, it may cause current distortion in CSR 100 when the input voltages intersect each other, as shown in FIG. 10. Similar effect may occur in Swiss Rectifier which has a three-phase diode bridge in its topology. The clamped voltage on the diode bridge will fluctuate at the voltage intersections, leading to false current pulse and distortion.

The current distortion occurs near every intersection of the input voltages, as shown in FIG. 10. The analysis of the distortion may be carried out in Sector 2 ($\pi/6 < \omega t \leq (\pi/3-\phi)$, $v_a \geq v_b > 0 > v_c$) and Sector 3 ($(\pi/3-\phi) < \omega t < \pi/2$, $v_b > v_a > 0 > v_c$). If the voltage on the input capacitor may be assumed to be ideal sinusoidal without any switching-frequency ripple, $v_a$ and $v_b$ would have fixed relationship in each sector and intersect each other only at the boundary of the two sectors.

Figure 12:
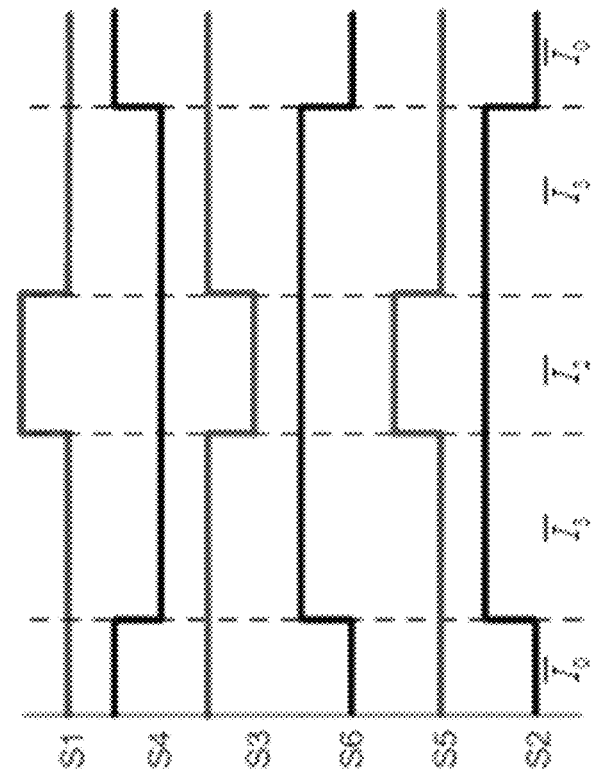
FIG. 12 illustrates exemplary control signal consequences of a switching period Ts for phase sector 3, according to an embodiment of the present disclosure.

The equivalent circuit of CSR 100 in Sector 2 may be considered with $v_a \geq v_b > v_c$. D1a may be conducting and switch 111.1 may be connected with phase a. The space vector arrangement in Sector 2 may be shown in FIG. 11, where switch 111.1 and switch 111.5 share the current of phase a in vector $\vec{I}_2$. Similarly, the equivalent circuit of CSR 100 in Sector 3 may be considered with $v_b > v_a > v_c$, where D1b may be conducting and switch 111.1 may be connected with phase b. The space vector arrangement in Sector 3 may be shown in FIG. 12, where switch 111.1 and switch 111.3 share the current of phase b in vector $\vec{I}_3$.

Figure 11:
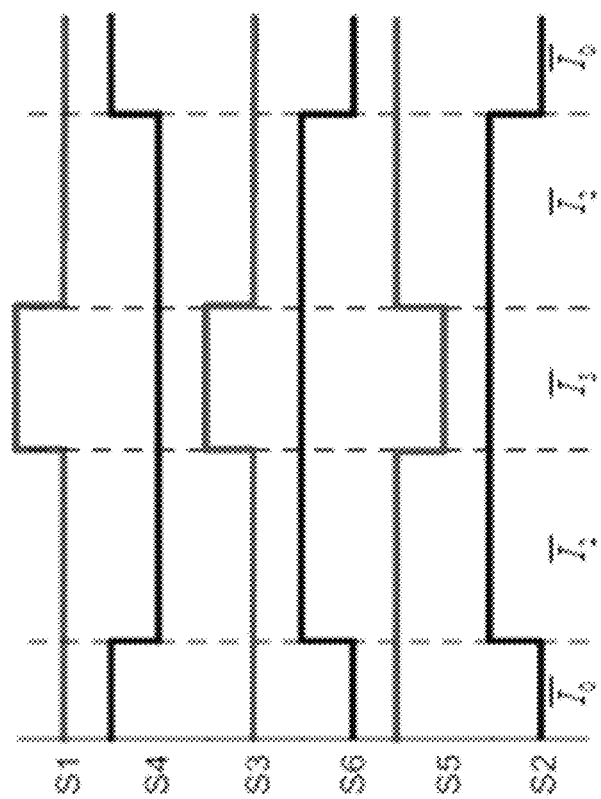
FIG. 11 illustrates exemplary control signal consequences of a switching period Ts for phase sector 2, according to an embodiment of the present disclosure.
Figure 13:
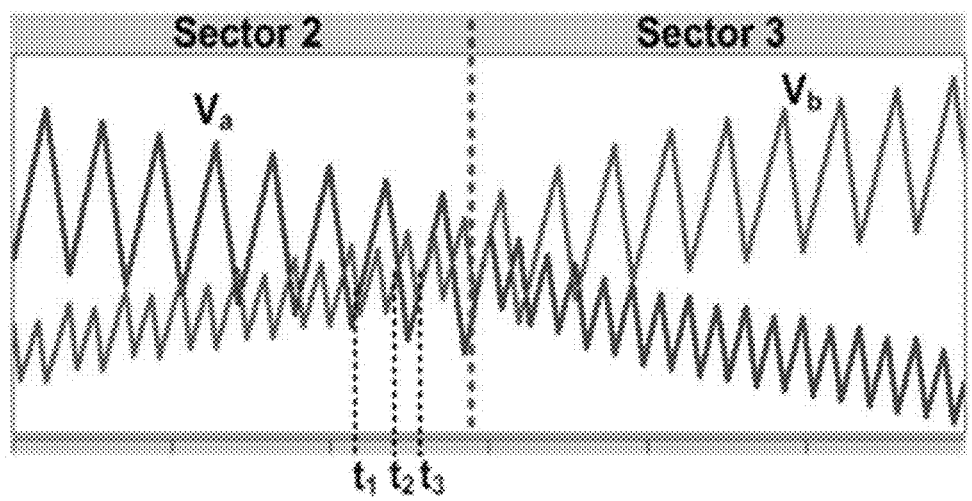
FIG. 13 illustrates exemplary intersections of $v_a$ and $v_b$ in a CSR, according to an embodiment of the present disclosure.

However, the input voltages always have switching-frequency ripple on them due to the finite input capacitance. Actually $v_a$ and $v_b$ have multiple intersections near the boundary of Sector 2 and Sector 3, as shown in FIG. 11. If CSR 100 may be still drove with the gate signals in FIG. 11 for Sector 2, there will be false current pulses generated near the voltage intersections. For example, there may be three intersections at $t_1$, $t_2$ and $t_3$ in Sector 2, as shown in FIG. 13. When $t_2 < t < t_3$, $v_b > v_a$. The equivalent circuit changes, while the gate signals in FIG. 11 for Sector 2 may be still applied to the switches. When switch 111.1 and switch 111.5 may be turned on simultaneously, phase b may be connected with phase a directly. Although the duration may be short, their voltage difference $v_b - v_a$ will generate a false current between these two phases. As a result, $i_a$ will lose current pulses and $i_b$ will gain extra current pulses. The analysis of the current distortion may be verified in simulation.

To reduce the distortion, one effective way may be to reduce the ripple of the input voltages by increasing the switching frequency or adding more input capacitors, but it will sacrifice the efficiency or the power density.

Figure 14:
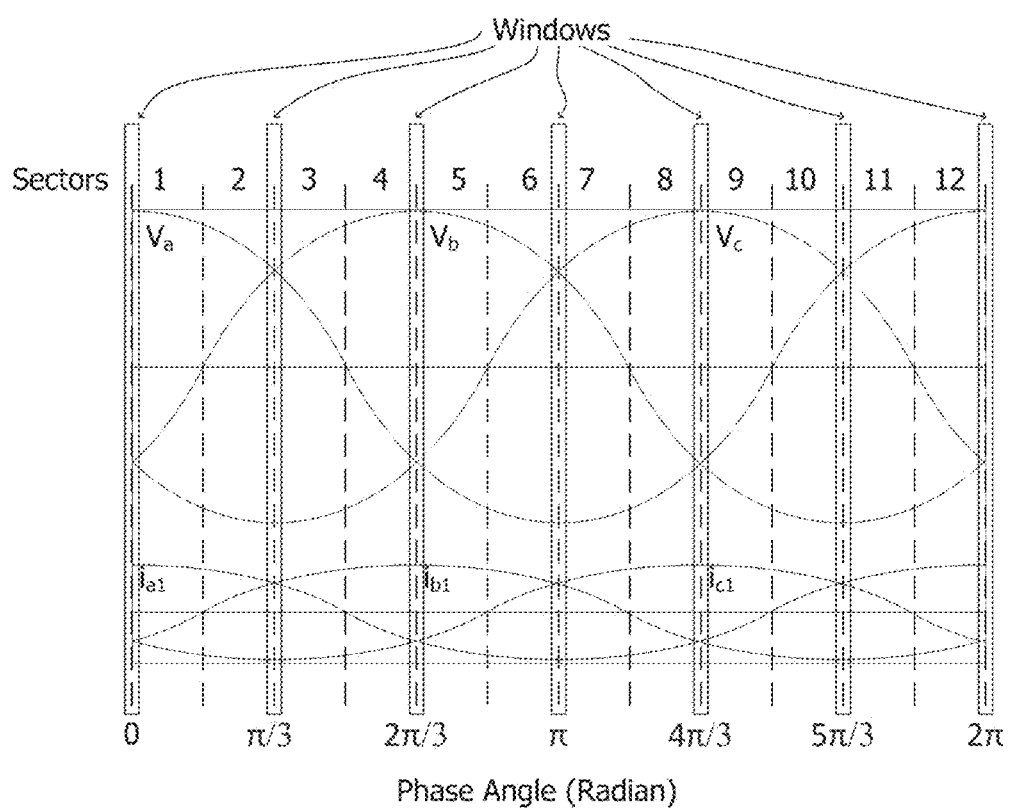
FIG. 14 illustrates exemplary modified timing windows for AC input signals for generating modified modulation control signals, according to an embodiment of the present disclosure.

A modified modulation scheme may be proposed to reduce the current distortion. Narrow timing windows may be placed near the intersections of the input voltages, to allow modified control sequences in the timing windows, as shown in FIG. 14. The modulation scheme may be modified within the window area ($|v_x| < k$, x=ab,bc,ca). k may be decided by the input voltage ripple on the filter capacitors 984-986, detected by the sensor 989 connected to the controller 190. Their relationship may be given by $$k > \Delta v_{pp} = \frac{I_{dc} M(1-M)}{C_s f_s},$$

where the $$\text{modulation index} = \frac{2V_{dc}}{3V_m \cos(\varphi)},$$

$V_{dc}$ may be the dc voltage, $I_{dc}$ the dc current, $C_s$ the input filter capacitance, $f_s$ the switching frequency, $V_m$ the amplitude of input voltage, and φ the phase difference between input voltage and input current of CSR 100.

Figure 15A:
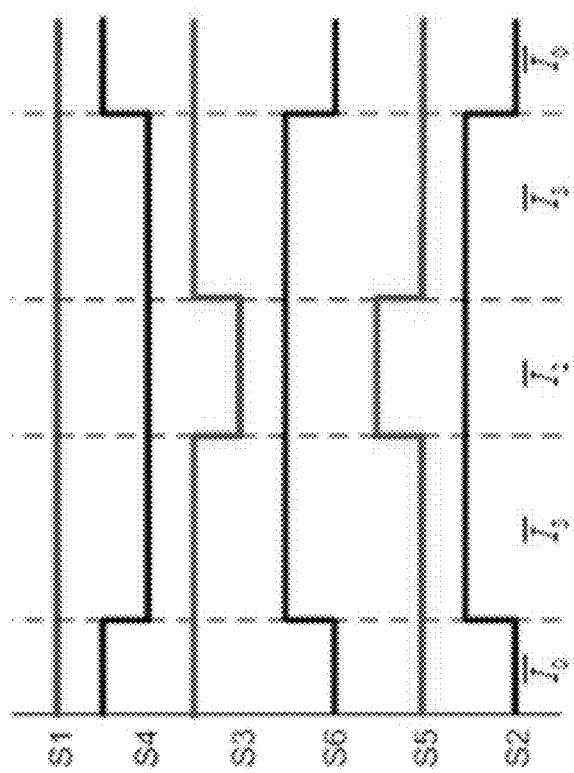
FIG. 15A illustrates exemplary control signal consequences of a switching period Ts for a modified modulation when $|v_{ab}|<k$ in Sector 2, according to an embodiment of the present disclosure.
Figure 15B:
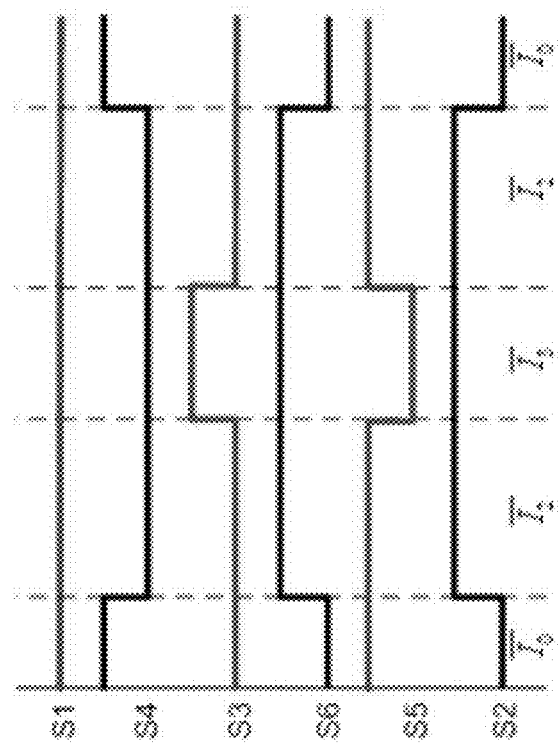
FIG. 15B illustrates exemplary control signal consequences of a switching period Ts for a modified modulation when $|v_{ab}|<k$ in Sector 3, according to an embodiment of the present disclosure.

In the proposed modulation in FIG. 15A, the arrangement of the space vectors in the windows may be kept similar as the modulation scheme for the previous adjacent sector 2, so that the voltage stress on the devices and the switching loss may be still minimized. Only the conduction state in vector $\vec{I}_2$ changes from [(S$_1$S$_5$), (S$_2$S$_6$)] to [S$_5$, (S$_2$S$_6$)] when $|v_{ab}|<k$. Switch 111.1 may be kept off in the window at the end of Sector 2 near the voltage intersections. In this way, the fluctuation of $v_{ab}$ will not generate false current pulse in the input current. Similarly, switch 111.1 may be kept off when $|v_{ab}|<k$ in the window at the end of Sector 3, as shown in FIG. 15B.

Although the current of phase a may be only carried by a single switch in vector $\vec{I}_2$ in Sector 2, the total conduction loss of CSR 100 will not change much since the proposed modulation only applies for a short period of time in the narrow timing window. Based on detailed analysis, the increased conduction loss may be given by $$P_{window} = 6I_{dc}^2 M\cos(\varphi)(R_T + R_D)\left[\frac{\sqrt{3}}{2} - \cos\left(\frac{\pi}{6} + \frac{k}{\sqrt{3}\,V_m}\right)\right],$$

where $R_T$ and $R_D$ may be the on-resistance of the switch and diode respectively. For a 7.5 kW prototype CSR, the total conduction loss may be increased by 4.6%. CSR 100 with the proposed modulation scheme may still save as much as 16% conduction loss, compared with the traditional CSR.

A 7.5 kW prototype CSR was built to verify the proposed modulation scheme. The specifications of the prototype may be listed in Table IV. 1200 V/20 A SiC MOSFETs and 1200 V/18 A SiC Schottky diodes may be applied as the switches and diodes respectively in the prototype for their low on resistance and high switching speed. The switching frequency for the prototype may be 28 kHz to balance between the efficiency and filter size.

TABLE IV

SPECIFICATION OF CSR

| | |
|---|---|
| Output power | 7.5 kW |
| Input voltage | 480 Vac, 60 Hz |
| Input inductor | 110 µH each phase |
| Input capacitor | 6.8 µF each phase |
| Output voltage | 400 Vdc |
| Output capacitor | 150 µF |
| Switching frequency | 28 kHz |

With the modified modulation scheme, under 8 kW output power, the total harmonic distortion (THD) of the input current may be 2% and the input power factor may be 0.99. With the original modulation scheme the input current may have large distortion caused by voltage intersections under 4 kW output power. After applying the modified modulation scheme with 20 V window ($|v_x|<20$ V, x=ab,bc,ca), the distortion in the input current may be dramatically reduced. The total harmonic distortion (THD) of the input current drops from 8.1% to 2.4%.

Figure 16:
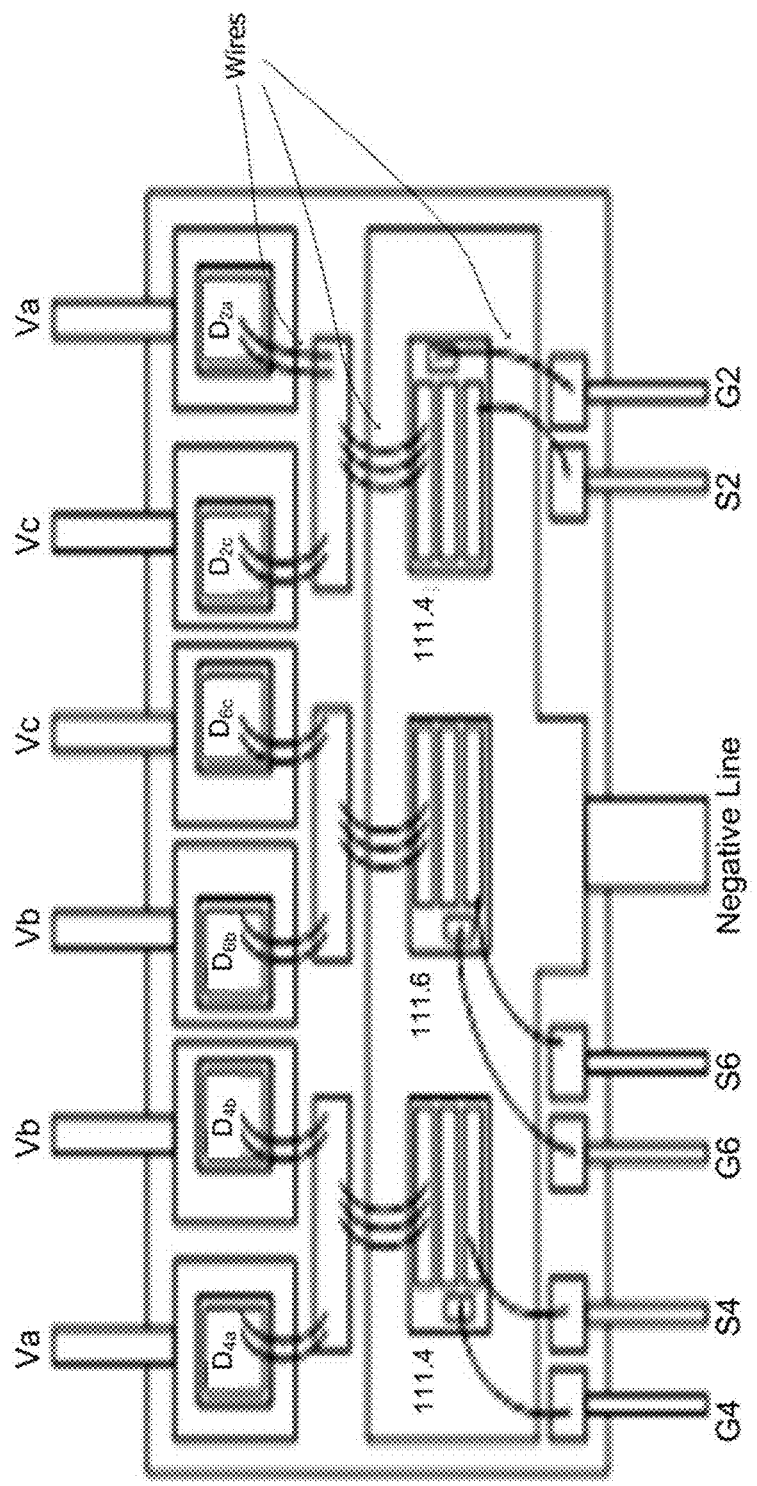
FIG. 16 illustrates exemplary layout of the all-SiC power module for a CSR, according to an embodiment of the present disclosure.

According to an embodiment an all-SiC power module may be designed and built for high-density CSR 100, as shown in FIG. 16. It may include three switches, forming a commutation unit in CSR 100, for the lower half of the CSR 100 in FIG. 1. 50 A SiC Schottky diode CPW5-1200-Z050B and 50 A SiC MOSFET CPM2-1200-0025B from CREE may be used in the power module. The semiconductor dies may be placed on the direct bonded copper (DBC) substrate and the wire bonds may be used for interconnection. The switching characteristics of the power module may be measured with the power module under different operating conditions.

The power module for CSR 100 in FIG. 16 may also be easily reconfigured as the traditional CSR. The two pins connected with two branch diodes may be shorted with copper bars, so that the two branch diodes may be paralleled in the traditional CSR. The total die area may be kept the same in both configurations. In this way, the commutation in both DCSR and the traditional CSR may be measured and compared using the same test setup.

Moreover, the commutations in CSR 100 occur between three switches, rather than two in the traditional CSR. Two devices sharing the dc-link current will be turned on/off simultaneously in CSR 100. The switching speed and switching energy in CSR 100 may be different from those in the traditional CSR.

A test board may be designed and built to test the switching characteristics of the power module. The all-SiC power module may be mounted on the back side of the PCB. A 15 mΩ coaxial shunt SDN-015 with 1.2 GHz bandwidth from T&M Research may be used for current measurement. A high-voltage differential probe THDP0200 with 200 MHz bandwidth from Tektronix may be used for voltage measurement. The test setup may be include a test board, an oscilloscope, a load inductor, a DSP board, 600 V power supply and an auxiliary power supply. The DSP board may generate the gate signals to drive the devices.

The commutations in CSR 100 include three switches. Commutation Loop 1 may occur when $v_c>v_b>v_a$, switch 111.6 may be kept on in the test. Switch 111.2 and switch 111.4 may be turned on at the beginning of the first pulse and the dc power supply charges the load current $I_{dc}$ to a given level. Then switch 111.2 and switch 111.4 may be turned off simultaneously at the end of the first pulse. $I_{dc}$ may be freewheeled through switch 111.6 afterwards. In the second pulse, switch 111.2 and switch 111.6 may be turned on simultaneously and kept on for a short time. In this process, the voltage and current waveforms in the turn-on/off process may be measured. In Commutation loop 1, there may be two minor loops in parallel in the power modules. They may be almost symmetric, which may be beneficial to reduce the equivalent parasitic inductance in the commutation loop.

The switching waveforms of Commutation Loop 1 may occur when $v_{ba}=600$ V and $I_{dc}=60$ A. The external gate resistor may be 20Ω for each switch. The switching waveforms of switch 111.2 and switch 111.4 may be not always the same. The current resonance may be smaller in switch 111.4 than that in switch 111.2. Switch 111.4 has longer delay time in both turn-on and turn-off processes. The switching speed difference between switch 111.2 and switch 111.4 may come from two aspects, the semiconductor die and the module layout.

Commutation Loop 2 may occur where switch 111.2 may be kept on, and switch 111.4 and switch 111.6 may be sharing the load current. The two minor loops may be not symmetric. The switching waveforms may occur in Commutation Loop 2. The voltage and current spikes may be more serious in Commutation Loop 2 than those in Commutation Loop 1. The resonance frequency may be lower and its magnitude may be higher, indicating larger parasitic inductance in the loop.

From the comparison of the switching waveforms in the two commutation loops in CSR 100, it may be demonstrated that the more symmetric commutation loop has less parasitic inductance, lower voltage and current spikes. By configuring the power module, the switching waveforms in the traditional CSR may also be measured with the same test setup. Commutation Loop 3 in traditional CSR may occur where switch 111.4 and switch 111.6 may be commutating with each other.

The switching waveforms in Commutation Loop 3 in traditional CSR may be compared with those in Commutation Loop 1 in CSR 100 when $v_{ba}$=600 V and $I_{dc}$=60 A. The turn-off waveforms may be compared. CSR 100 has longer voltage rise time than the traditional CSR in the turn-off process. The delay time before the current falls may be also longer, and the resonance frequency may be higher in CSR 100. Since the current may be shared in two switches in CSR 100, each switch has lower plateau gate voltage and charge rate of the junction capacitor, leading to longer voltage rise time and larger turn-off energy.

The turn-on waveforms may be compared. CSR 100 has shorter voltage fall time and current rise time than the traditional CSR in the turn-on process. Because the current may be shared in two switches in CSR 100, each switch has lower plateau gate voltage, higher current rise rate and discharge rate of the junction capacitor, leading to less turn-on energy. The amplitude of the resonance may be comparable in the two topologies, while the resonance frequency may be higher in CSR 100. Despite higher turn-on speed, CSR 100 does not have obviously worse resonance since its parasitic inductance may be smaller with two minor loops in parallel.

Under different voltage and current conditions, the switching energy may be calculated based on the measured switching waveforms. The turn-off energy $E_{off}$ of the two topologies may be compared. $E_{off}$ may be higher in CSR 100, especially when the current may be low and the voltage may be high (voltage rise time may be much longer in CSR 100). When the current may be high, less current fall time in CSR 100 brings it lower $E_{off}$ than the traditional CSR.

The turn-on energy $E_{on}$ of the two topologies may be compared. $E_{on}$ may be lower in CSR 100, especially when both voltage and current may be high (current rise time may be much less in CSR 100). When the current may be low, the current rise time tends to be the same and the switching energy may be very close in both topologies.

Therefore, the total switching energy may be lower in CSR 100, especially under large current and voltage.

Figure 17:
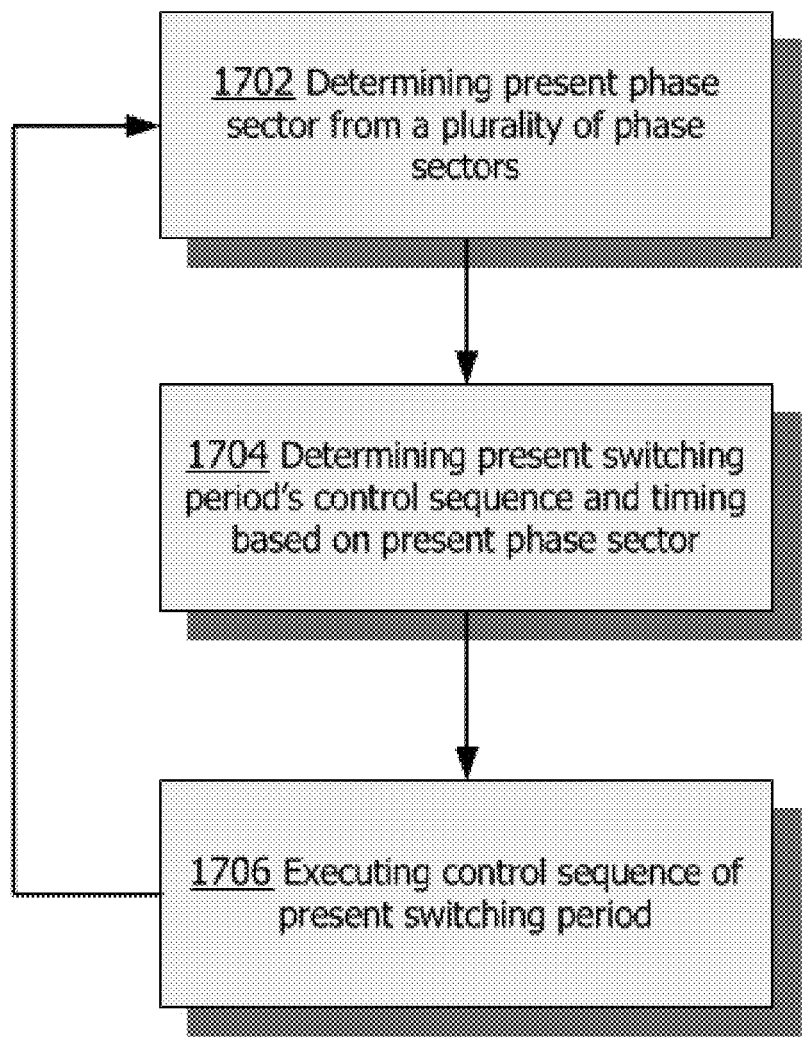
FIG. 17 illustrates a method of controlling the converter according to an embodiment of the present disclosure.

FIG. 17 illustrates a method 1700 of controlling the converter according to an embodiment of the present disclosure.

At block 1702, determining, by a controller, a present phase sector from a plurality of phase sectors of three AC inputs.

At block 1704, determining the present switching period's control sequence and timing based on present phase sector, filtered input voltage levels, output currents, and/or output voltage.

At block 1706, executing control sequence of present switching period.

Controllers described herein may include non-transitory computer readable medium storing computer programs/codes/instructions that are executable by a processor to control the CSRs to perform the above illustrated modulation schemes and methods.

It may be appreciated that the disclosure may be not limited to the described embodiments, and that any number of scenarios and embodiments in which conflicting appointments exist may be resolved.

Although the disclosure has been described with reference to several exemplary embodiments, it may be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means and embodiments, the disclosure may be not intended to be limited to the particulars disclosed; rather the disclosure extends to all functionally equivalent structures, methods, and uses such as are within the scope of the appended claims.

Although the present application describes specific embodiments which may be implemented as code segments in computer-readable media, it may be to be understood that dedicated hardware implementations, such as application specific integrated circuits, programmable logic arrays and other hardware devices, may be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure may be intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter may be to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be to be determined by the broadest permissible interpretation of the following claims and their equivalents, and shall not be restricted or limited by the foregoing detailed description.

What is claimed is:

1. A three-phase current source rectifier (CSR) with three alternating-current (AC) inputs, comprising:
    a free-wheeling diode, a first leg, a second leg, and a third leg connected in parallel between a positive line and a negative line, wherein
        the first leg includes a first pair of diodes and a second pair of diodes connected in parallel with each other and in series between a first pair of switches,
        the second leg includes a third pair of diodes and a fourth pair of diodes connected in parallel with each other and in series between a second pair of switches,
        the third leg includes a fifth pair of diodes and a sixth pair of diodes connected in parallel with each other and in series between a third pair of switches,
        the first AC input is connected between the first pair of diodes and between the sixth pair of diodes,
        the second AC input is connected between the second pair of diodes and between the third pair of diodes, and
        the third AC input is connected between the fourth pair of diodes and between the fifth pair of diodes; and
    a controller to control operation of the three pairs of switches.

2. The rectifier of claim 1, wherein each of the switches is controlled by the controller based upon the three AC inputs.

3. The rectifier of claim 1, wherein the controller determines a present phase sector from a plurality of phase sectors of the three AC inputs.

4. The rectifier of claim 1, further comprising a sensor to measure at least one of voltages of the three AC inputs, direct-current (DC) inductor current, and DC capacitor voltage.

5. The rectifier of claim 1, wherein the controller generates control signal sequences to selectably turn on or off the switches.

6. The rectifier of claim 5, wherein the controller controls the duration of the control signal sequences based upon the voltage of the three AC inputs.

7. The rectifier of claim 1, wherein the controller controls the switches to conduct current through two of the switches to the positive line and to conduct current through two different switches from the negative line.

8. The rectifier of claim 1, wherein at least one of the switches, the diodes, and the free-wheeling diode is a Silicon Carbide based device.

9. A three-phase alternating-current (AC) to direct-current (DC) converter, comprising:
    a three-phase AC filter receiving a three-phase AC power supply;
    at least one three-phase current source rectifier (CSR) connected to the three-phase AC filter; and
    an output filter connected to the at least one three-phase CSR to generate a DC output, wherein each of the at least one three-phase CSR has three AC inputs and comprises:
        a free-wheeling diode, a first leg, a second leg, and a third leg connected in parallel between a positive line and a negative line, wherein
            the first leg includes a first pair of diodes and a second pair of diodes connected in parallel with each other and in series between a first pair of switches,
            the second leg includes a third pair of diodes and a fourth pair of diodes connected in parallel with each other and in series between a second pair of switches,
            the third leg includes a fifth pair of diodes and a sixth pair of diodes connected in parallel with each other and in series between a third pair of switches,
            the first AC input is connected between the first pair of diodes and between the sixth pair of diodes,
            the second AC input is connected between the second pair of diodes and between the third pair of diodes, and
            the third AC input is connected between the fourth pair of diodes and between the fifth pair of diodes; and
        a controller to control operation of the three pairs of switches.

10. The converter of claim 9, wherein the controller controls the switches to conduct current through two of the switches to the positive line and to conduct current through two different switches from the negative line.

11. The converter of claim 9, wherein the controller determines a present phase sector from a plurality of phase sectors of the three AC inputs.

12. The converter of claim 9, further comprising a sensor to measure at least one of voltages of the three AC inputs, DC inductor current, and DC capacitor voltage.

13. The converter of claim 9, wherein the controller generates control signal sequences to selectably turn on or off the switches.

14. The converter of claim 13, wherein the controller controls the duration of the control signal sequences based upon the voltage of the three AC inputs.

15. The converter of claim 9, wherein at least one of the switches, the diodes, and the free-wheeling diode is a Silicon Carbide based device.

16. A method of generating a direct-current (DC) voltage comprising:
    receiving three-phase alternating-current (AC) voltages;
    based on the three-phase AC voltages, determining a present phase sector from a plurality of phase sectors; and
    generating, with a three-phase current source rectifier (CSR) having three AC inputs coupled to the three-phase AC voltages, two currents from a first of the three-phase AC voltages to a positive line of an output, and two currents from a negative line of the output to a second of the three-phase AC voltages, based on the present phase section, the CSR comprising:

a free-wheeling diode, a first leg, a second leg, and a third leg connected in parallel between the positive line and the negative line, wherein the first leg includes a first pair of diodes and a second pair of diodes connected in parallel with each other and in series between a first pair of switches, the second leg includes a third pair of diodes and a fourth pair of diodes connected in parallel with each other and in series between a second pair of switches, the third leg includes a fifth pair of diodes and a sixth pair of diodes connected in parallel with each other and in series between a third pair of switches, the first AC input is connected between the first pair of diodes and between the sixth pair of diodes, the second AC input is connected between the second pair of diodes and between the third pair of diodes, and the third AC input is connected between the fourth pair of diodes and between the fifth pair of diodes; and a controller to control operation of the three pairs of switches.

17. The method of claim 16, further comprising generating, with the controller, control sequences to selectably turn on and off the switches for controlling the current generation based on the present phase sector.

18. The method of claim 16, wherein the current generation comprises controlling, with the controller, the switches to conduct current through two of the switches to the positive line and to conduct current through two different switches from the negative line.

* * * * *